(12) United States Patent
Wang

(10) Patent No.: US 10,141,386 B2
(45) Date of Patent: Nov. 27, 2018

(54) ARRAY SUBSTRATE, DISPLAY PANEL AND DISPLAY DEVICE

(71) Applicants: BOE TECHNOLOGY GROUP CO., LTD., Beijing (CN); BOE OPTICAL SCIENCE AND TECHNOLOGY CO., LTD., Suzhou, Jiangsu (CN)

(72) Inventor: Tao Wang, Beijing (CN)

(73) Assignees: BOE TECHNOLOGY GROUP CO., LTD., Beijing (CN); BOE OPTICAL SCIENCE AND TECHNOLOGY CO., LTD., Suzhou (CN)

( * ) Notice: Subject to any disclaimer, the term of this patent is extended or adjusted under 35 U.S.C. 154(b) by 0 days.

(21) Appl. No.: 15/325,282

(22) PCT Filed: Jul. 26, 2016

(86) PCT No.: PCT/CN2016/091728
§ 371 (c)(1),
(2) Date: Jan. 10, 2017

(87) PCT Pub. No.: WO2017/071334
PCT Pub. Date: May 4, 2017

(65) Prior Publication Data
US 2017/0294496 A1    Oct. 12, 2017

(30) Foreign Application Priority Data
Oct. 29, 2015  (CN) .......................... 2015 1 0727365

(51) Int. Cl.
*H01L 29/04* (2006.01)
*H01L 27/32* (2006.01)
(Continued)

(52) U.S. Cl.
CPC .......... *H01L 27/3253* (2013.01); *H01L 27/12* (2013.01); *H01L 27/3276* (2013.01);
(Continued)

(58) Field of Classification Search
CPC ............. H01L 27/3253; H01L 27/3276; H01L 27/1222; H01L 27/124; H01L 27/1248;
(Continued)

(56) References Cited

U.S. PATENT DOCUMENTS 6,091,194 A  *  7/2000  Swirbel ............... H01L 27/3253
                                                        313/498
8,586,171 B2 * 11/2013  Kim ........................ B32B 37/14
                                                         349/122
(Continued)

FOREIGN PATENT DOCUMENTS

CN      102402088 A      4/2012
CN      104035253 A      9/2014
(Continued)

OTHER PUBLICATIONS

The Second Chinese Office Action dated Dec. 5, 2017; Appln. No. 201510727365.9.
(Continued)

*Primary Examiner* — Thinh T Nguyen
(74) *Attorney, Agent, or Firm* — Ladas & Parry LLP

(57) ABSTRACT

Disclosed is an array substrate, a display panel, and a display device. The array substrate includes: a substrate (100), a plurality of pixel units (110) disposed on a side of the base substrate (100), a chip (200) configured for providing signal to the pixel units (110), signal lines (120) corresponding to each of pixel units (110), and via holes (130) penetrating the base substrate (100). By disposing the chip (200) on the side of the base substrate (100) opposed to the pixel units (110) and electrically connecting the pixel units (110) to the chip (200) through the signal lines (120) in the via holes (130), the frame portion which is used for accommodating the chip could be omitted and a real frameless design is achieved.

19 Claims, 4 Drawing Sheets

(51) Int. Cl.
  *H01L 51/00* (2006.01)
  *H01L 29/786* (2006.01)
  *H01L 27/12* (2006.01)

(52) U.S. Cl.
  CPC ...... *H01L 51/0096* (2013.01); *H01L 27/1248* (2013.01); *H01L 29/78669* (2013.01); *Y02E 10/549* (2013.01)

(58) Field of Classification Search
  CPC ........... H01L 29/78669; H01L 27/1288; H01L 29/66765
  USPC ....... 257/40, 59, 72, 82; 438/82, 99, 48, 128
  See application file for complete search history.

(56) References Cited

U.S. PATENT DOCUMENTS

| | | | | |
|---|---|---|---|---|
| 9,773,855 | B2* | 9/2017 | Wu | ...................... H01L 27/3276 |
| 2003/0048395 | A1* | 3/2003 | Yasui | ................ G02F 1/136209 |
| | | | | 349/43 |
| 2008/0150419 | A1* | 6/2008 | Kang | ..................... H01L 51/524 |
| | | | | 313/504 |
| 2013/0141470 | A1* | 6/2013 | Wang | ................... G09G 3/3648 |
| | | | | 345/690 |
| 2015/0340419 | A1 | 11/2015 | Li et al. | |
| 2016/0336540 | A1 | 11/2016 | Li | |

FOREIGN PATENT DOCUMENTS

| | | |
|---|---|---|
| CN | 104916252 A | 9/2015 |
| CN | 104992956 A | 10/2015 |
| CN | 105206625 A | 12/2015 |
| CN | 205069641 A | 3/2016 |
| CN | 205069641 U | 3/2016 |

OTHER PUBLICATIONS

International Search Report and Written Opinion dated Sep. 26, 2016; PCT/CN2016/091728.

The First Chinese Office Action dated Jul. 5, 2017; Appln. No. 201510727365.9.

\* cited by examiner

ARRAY SUBSTRATE, DISPLAY PANEL AND DISPLAY DEVICE

TECHNICAL FIELD

The disclosed herein relates to display technology, more specifically, to an array substrate, a display panel and a display device.

BACKGROUND

With the increasing development of the display technology, the display panel, which is used in mobile terminals such as personal computers, portable terminals and various kinds of information devices and the like, undergoes a rapid progress. Most of the mobile terminals in the market adopt flat display devices, such as liquid crystal display devices, plasma display devices, field emission display devices, organic light emitting diode display devices and the like, as their display panels. The display panel includes a display region and a peripheral region. The peripheral region includes a chip used for controlling the pixel units in the display region. The peripheral region of the display panel has to be relative wide due to the chip which occupies it, such that the frame region of the display panel has to be larger and the visual effect of the display screen is thus affected.

Currently, in order to achieve frameless display effect, two approaches are raised. In one of the approaches, the size of display module is same as that of glass cover plate and the frame of the display panel is canceled. When no image is displayed, the display looks as though it does not have any frame. However, a black frame would still be watched around the screen by viewers while the display panel is actually being used. In the other approach, an optical component is arranged in the peripheral region of the glass cover plate to direct the light into the frame region in the peripheral of the panel, so that the frameless visual effect is achieved by the sense of vision when the viewers watch the panel. However, compared with the normal display region, the frame region of the display panel manufactured through this approach has lower brightness and resolution and is apt to display ghosting image, which result in a deteriorated display effect.

SUMMARY

In first aspect of the disclosed herein, it is provided an array substrate, comprising: a base substrate, a plurality of pixel units disposed on a side of the base substrate, a chip for providing signal to the plurality of pixel units, and signal lines corresponding to each of the plurality of the pixel units; the chip is located on an opposed side of the base substrate having the plurality of pixel units disposed thereon; via holes penetrating at least the base substrate are disposed on the array substrate; the signal lines electrically connect each of the plurality of the pixel units with the chip through the via holes.

In second aspect of the disclosed herein, it is provided a display panel comprising above array substrate.

In third aspect of the disclosed herein, it is provided a display device comprising above display panel.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

FIG. 2a schematically illustrates a top view of the array substrate shown in FIG. 1a;

FIG. 2b schematically illustrates another top view of the array substrate shown in FIG. 1a;

DETAILED DESCRIPTION

Figure 1A:
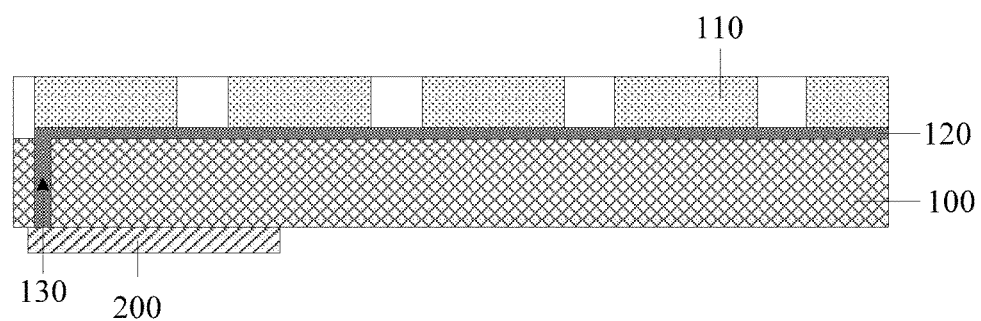
FIG. 1a schematically illustrates a cross section of an array substrate provided by an embodiment of the disclosed herein.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure Thickness and shape of every layer in the drawings are not consistent with actual scale and merely intend for illustrative purpose throughout the embodiments of the disclosed herein.

Figure 1B:
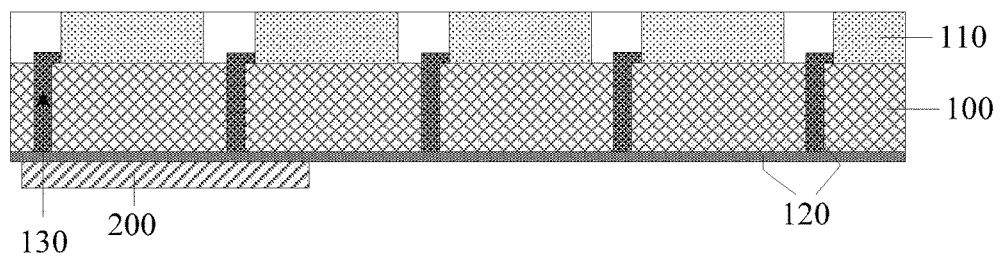
FIG. 1b schematically illustrates a cross section of another array substrate provided by an embodiment of the disclosed herein.

As illustrated in FIG. 1a and FIG. 1b, an embodiment of the disclosed herein provides an array substrate comprising: a substrate 100, a plurality of pixel units 110 arranged as a matrix on one side of the base substrate 100, a chip 200 configured for providing signals to the pixel units 110, and signal lines 120 corresponding to the pixel units 110. The chip 200 is arranged on the other side of the base substrate 100 opposed to the pixel units 110. The array substrate is provided with via holes 130 penetrating at least the base substrate 100, and the signal lines 120 electrically connect the pixel units 110 with the chip 200 through the via holes 130.

In the array substrate provided in the embodiment of the disclosed herein, the chip is arranged on the side of the base substrate which is opposed to the pixel units and the signal lines electrically connects the pixel units with the chip through the via holes, so that the frame portion for accommodating the chip could be omitted and a real frameless design is achieved.

Figure 2A:
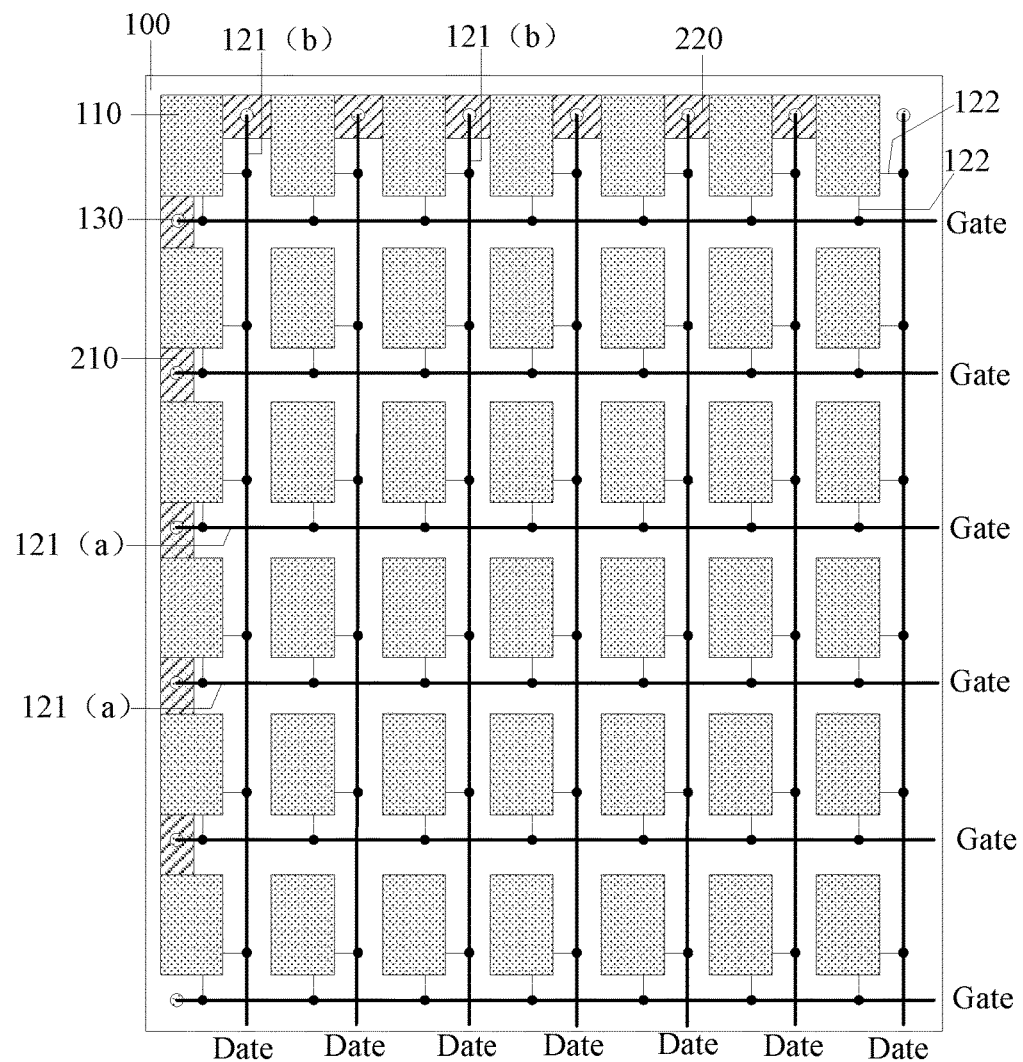
Figure 2B:
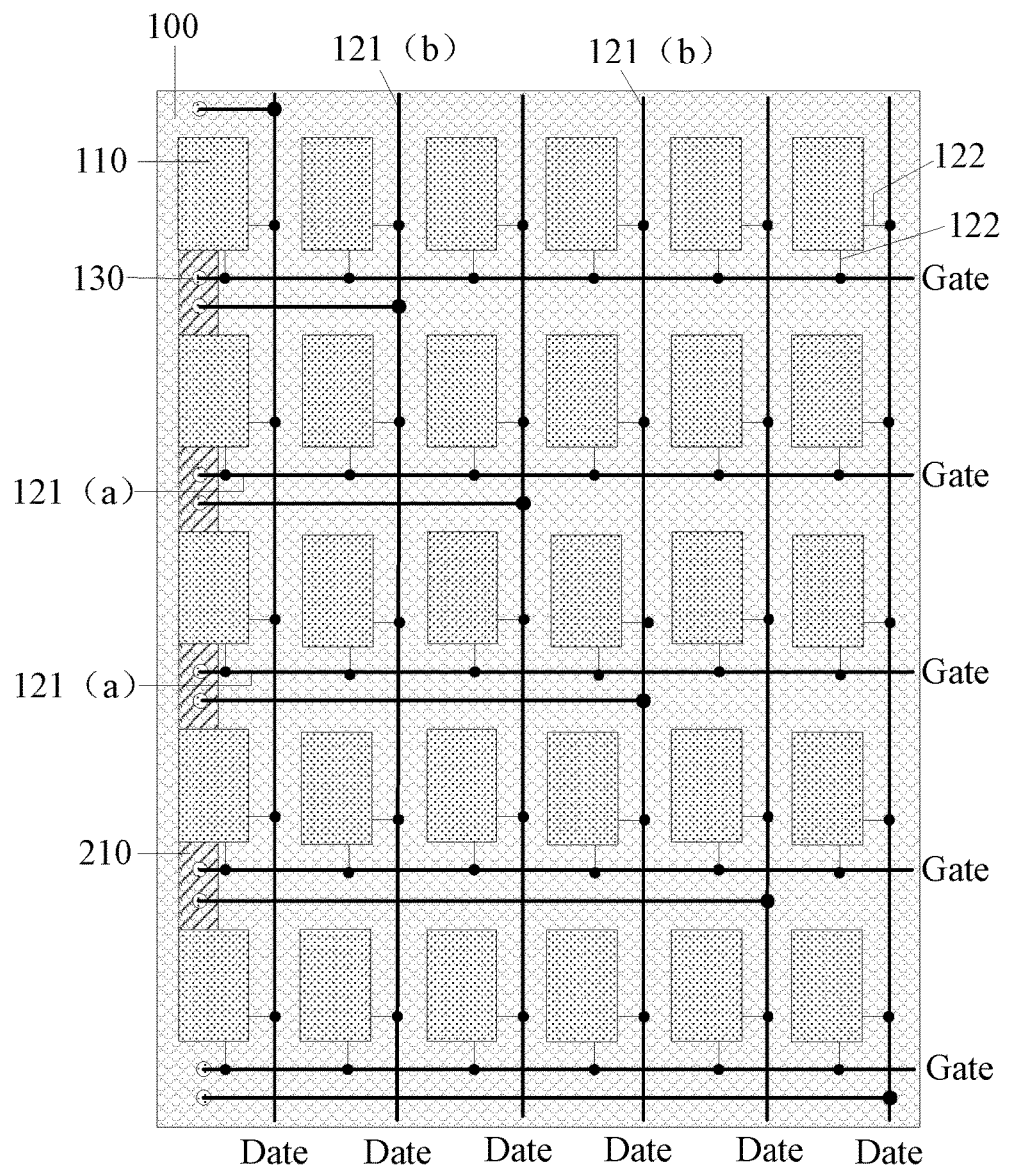
Figure 2C:
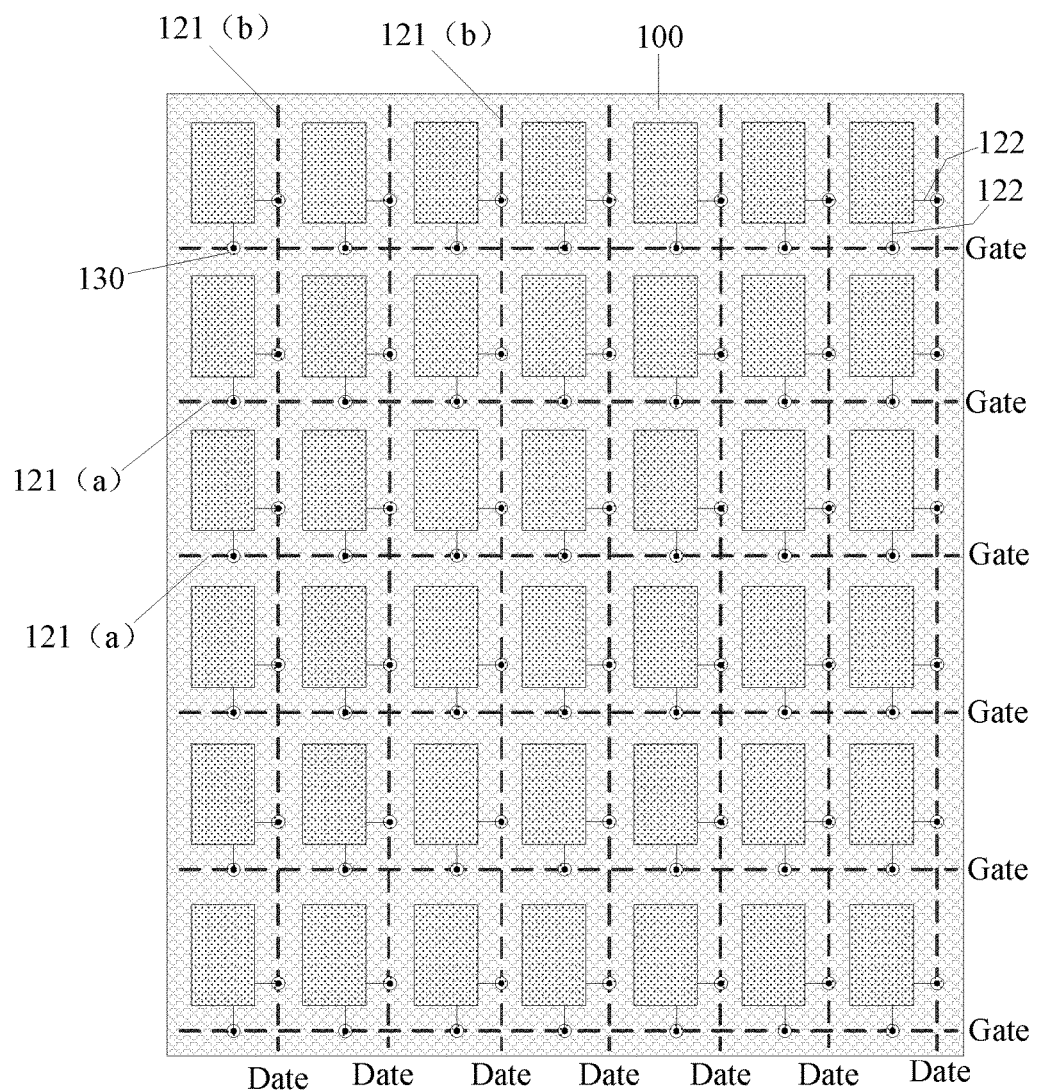
FIG. 2c schematically illustrates a top view of the array substrate shown in FIG. 1b.

In at least some of the embodiments, as illustrated in FIGS. 2a to 2c, the signal lines 120 comprises: wires 121(a), 121(b), both of which electrically connecting to the chip 200; and connection wires 122 electrically connecting the wires 121(a), 121(b) with their corresponding pixel units 110.

For example, as illustrated in FIG. 2a and FIG. 2b, all the wires 121(a), 121(b) and the connection wires 122 are arranged on the side of the base substrate 100 having the pixel units 110 dispose thereon. The wires 121(a), 121(b) are electrically connected to the chip 200 through the via holes 130. That is, through the connection wires 122, the pixel units 110 are connected to the wires 121(a), 121(b), which are then electrically connected to the chip 200 through the via holes 130.

In at least some of the embodiments, the number of the via holes for electrically connecting one of the wires to the chip may be one or more than one, and that is not limited herein.

For example, as illustrated in FIG. 2c, the connection wires 122 are arranged on the side of the base substrate 100 having the pixel units 110 disposed thereon, the wires 121(a), 121(b) are arranged on the other side of the base substrate 100 having the chip 200 disposed thereon, and the connection wires 122 electrically connected to the pixel units 110 are connected to their corresponding wires 121(a), 121(b) through the via holes 130. That is, the connection wires 122 electrically connected to the pixel units 110 pass through the via holes 130 and are electrically connected to the wires 121(a), 121(b), and the wires 121(a), 121(b) are then electrically connected to the chip 200.

In at least some of the embodiments, the number of the via holes for electrically connecting one of connection wires with one of wires may be one or more than one, and that is not limitative herein.

For example, as illustrated in FIG. 2a to FIG. 2c, the wires 121(a), 121(b) comprises first wires 121(a) extending in the direction along the rows of the pixel units 110 and second wires 121(b) extending in the direction along the columns of the pixel units 110. It could be contemplated that wires may extend along other directions, and that is not limitative herein. In the followings, the array substrate will be described by taking the first wires and second wires included in the array substrate as example.

In at least some of the embodiments, as illustrated in FIG. 2a, when the wires 121(a), 121(b) are arranged on the side of the base substrate 100 having the pixel units 110 disposed thereon, the via holes 130 for accommodating the first wires 121(a) are located in the regions where the first wires 121(a) pass by and adjacent to the ending pixel units 110 located at an end of every row of pixel units 110. Alternatively, the via holes 130 for accommodating the first wires 121(a) are located in the regions where the first wires 121(a) pass by and adjacent to the other regions besides the ending pixel units 110, and that is not limitative herein.

To reduce the process complexity of manufacturing the via holes, in at least some of the embodiments, as illustrated in FIG. 2a, the via holes 130 corresponding to the first wires 121(a) are located in the regions where the first wires 121(a) pass by and adjacent to the ending pixel units 110 on the same end of every row of pixel units 110.

In at least some of the embodiments, as illustrated in FIG. 2a, when the wires 121(a), 121(b) are arranged on the side of the base substrate 100 having the pixel units 110 disposed thereon, the via holes 130 for accommodating the second wires 121(b) are located in the regions where the second wires 121(b) pass by and adjacent to the ending pixel units 110 of every column of pixel units 110. Alternatively, the via holes 130 for accommodating the second wires 121(b) are located in the regions where the second wires 121(b) pass by and adjacent to other regions besides the ending pixel units 110, and that is not limitative herein.

To reduce the process complexity of manufacturing the via holes, as illustrated in FIG. 2a, when the wires 121(a), 121(b) are arranged on the side of the base substrate 100 having the pixel units 110 disposed thereon, the via holes 130 for accommodating the second wires 121(b) are located in the region which the second wires 121(b) pass by and adjacent to the ending pixel units 110 on the same end of every column of pixel units 110.

To further reduce the complexity of process of manufacturing the via holes, as illustrated in FIG. 2a, when the wires 121(a), 121(b) are arranged on the side of the base substrate 100 having the pixel units 110 disposed thereon, the via holes 130 for accommodating the first wires 121(a) are located in the regions which the first wires 121(a) pass by and adjacent to the ending pixel units 110 on the same end of every row of pixel units, and the via holes 130 for accommodating the second wire 121(b) are located in the regions where the second wires 121(b) pass by and adjacent to the ending pixel units 110 on the same end of every column of pixel units. Thus, all the first wires 121(a) extend to the same end portion of the matrix of pixel units 110 along the direction of the rows of the pixel units 110, and all the second wirer 121(b) extend to the same end portion of the matrix of pixel units 110 along the direction of the columns of the pixel units 110, thereby simplifying the layout of the first and second wirer and thus improving the production efficiency.

In at least some of the embodiments, as illustrated in FIG. 2b, when the wires 121(a), 121(b) are arranged on the side of the base substrate 100 having the pixel units 110 disposed thereon, all the via holes 130 are located at the same end of each of columns or rows of pixel units 110. Both of the first wires 121(a) and the second wires 121(b) extend into their corresponding via holes 130. Thus, the via holes are arranged on only one side of the base substrate, thereby reducing the process complexity of fabricating the via holes and thus improving the production efficiency.

In at least some of the embodiments, as illustrated in FIG. 2c, when the wires 121(a), 121(b) are arranged on the side of the base substrate 100 having the chip disposed thereon, the via holes are located at the intersections of the connection wire 122 and the wires 121(a), 121(b). Arranging the wires on the side of the base substrate having the chip disposed thereon, the distance between the two adjacent pixel units can be reduced and the aperture ratio of every pixel units can be increased. However, since each of connecting wires corresponds to one of the via holes, more via holes are required and a more complex process of fabricating the via holes is needed.

It is noted that, the above array substrates provided in the embodiments of the disclosed herein include various signal lines for transmitting distinctive signals, for example, the signal lines include, but are not limited to, gate lines for transmitting gate scanning signal, data lines for transmitting data signal, reference signal lines for transmitting reference signal, and the like. While the above array substrates provided in the embodiments of the disclosed herein are applied in a touch panel, the array substrates may further comprise a touch signal line for transmitting touch control signal, and the like. It can be contemplated that, corresponding to the various signal lines, the chip on the array substrate may include various chips for providing distinctive signals, for example, the chip includes, but is not limited to, gate driving chip connected to the gate lines, source driving chip connected to the data lines, touch driving chip connected to the touch signal lines, and the like.

In at least some of the embodiments, as illustrated in FIG. 2a to FIG. 2c, the first wires 121(a) at least comprise gate lines "Gate", the second wires 121(b) at least comprise data lines "Date", the chip 200 at least comprises: a gate driving chip 210 connected to the gate lines and a source driving chip 220 connected to the data lines.

To minimize the attenuation of gate scanning signals transmitted in each gate line and data signals transmitted in each data line, in at least some of the embodiments, the gate driving chip connected to gate lines is arranged to be as closer to the via hole corresponding to the gate line as possible, and the source driving chip connected to the data line is arranged to be as closer to the via hole corresponding to the data line as possible.

In at least some of the embodiments, as illustrated in FIG. 2a and FIG. 2b, the gate driving chip 210 connected to the gate lines "Gate" is located in the region which is close to the ending pixel unit 110 of one of rows of pixel units, and the source driving chip 220 connected to the data lines "Date" is located in the region which is close to the ending pixel unit 110 of one of columns of pixel units 110.

An embodiment of the disclosed herein further provides a display panel comprising above array substrate provided in the embodiments of the disclosed herein.

The above display panel provided in the embodiments of the disclosed herein may be applied in the organic electroluminescent display panel, and may also be applied in the liquid crystal display panel.

When above display panel is applied in the liquid crystal display panel, the chip arranged beneath the base substrate may block the light from the backlight source. Therefore, in order to avoid the impact of the chip beneath the base substrate on the display effect, the above display panel provided in the embodiments of the disclosed herein is preferably used as an organic electroluminescent display panel.

When above display panel provided in the embodiments of the disclosed herein is an organic electroluminescent display panel, it has a top-emitting structure.

An embodiment of the disclosed herein further provides a display device comprising above display panel provided in the embodiments of the disclosed herein. The display device may be any product or component with display function, such as mobile phones, tablet computers, televisions, displays, laptop computers, digital photo frames, navigators and the like.

In the display panel and the display device provided in the embodiments of the disclosed herein, the chip is arranged on the side of the base substrate opposed to the pixel units and the signal lines electrically connects the pixel units to the chip through the via holes, such that the frame portion which is used for accommodating the chip can be omitted and a real frameless design is achieved.

What is described above is related to the illustrative embodiments of the disclosure only and not limitative to the scope of the disclosure; the scopes of the disclosure are defined by the accompanying claims.

The present application claims the priority of Chinese patent application No. 201510727365.9 filed on Oct. 29, 2015, the disclosure of which is incorporated herein by reference in its entirety.

The invention claimed is:

1. An array substrate, comprising: a base substrate, a plurality of pixel units disposed on a side of the base substrate, a chip for providing signal to the plurality of pixel units, and signal lines corresponding to each of the plurality of the pixel units,
    wherein the chip is disposed on an opposed side of the base substrate having the plurality of pixel units disposed thereon,
    wherein via holes penetrating at least the base substrate are disposed on the array substrate,
    wherein the signal lines electrically connect each of the plurality of the pixel units to the chip through the via holes,
    wherein the signal lines comprise wires that comprise first wires and second wires, the first wires at least comprise gate lines, and the second wires at least comprise data lines, and
    wherein the chip at least comprises a gate driving chip connected to the gate lines and a source driving chip connected to the data lines.

2. The array substrate of claim 1, wherein the signal lines further comprise connection wires, wherein the wires are electrically connected to the chip, and the wires are electrically connected to corresponding pixel units through the connection wires.

3. The array substrate of claim 2, wherein, both the wires and the connection wires are located on the side of the base substrate having the plurality of pixel units disposed thereon, and the wires are electrically connected to the chip through the via holes.

4. The array substrate of claim 2, wherein the connection wires are located on the side of the base substrate having the plurality of pixel units disposed thereon, the wires are located on a side of the base substrate having the chip disposed thereon, and the connection wires electrically connected to each of the plurality of pixel units are connected to corresponding wires through the via holes.

5. The array substrate of claim 1, wherein the first wires extend along a direction of rows of pixel units and the second wires extend along a direction of columns of pixel units.

6. The array substrate of claim 5, wherein the wires are located on the side of the base substrate having the plurality of pixel units disposed thereon, and the via holes for accommodating the first wires are located in the regions where the first wires pass by and adjacent to the ending pixel units located at an end of rows of pixel units.

7. The array substrate of claim 6, wherein the via holes for accommodating the second wires are located in the regions where the second wires pass by and adjacent to the ending pixel units located at an end of columns of pixel units.

8. The array substrate of claim 5, wherein the wires are located on the side of the base substrate having the plurality of pixel units disposed thereon; the via holes are located at same end of each of columns or each of rows of pixel units, and the wires extends into their corresponding via holes.

9. The array substrate of claim 5, wherein the wires are located on the side of the base substrate having the chip disposed thereon, and the via holes are located at intersections of the connection wires and the wires.

10. A display panel comprising the array substrate of claim 1.

11. The display panel of claim 10, wherein the display panel is an organic electroluminescent display panel.

12. A display device comprising the display panel of claim 10.

13. The display panel of claim 10, wherein the signal lines further comprise connection wires, wherein the wires are electrically connected to the chip, and the wires are electrically connected to corresponding pixel units through the connection wires.

14. The display panel of claim 13, wherein, both the wires and the connection wires are located on the side of the base substrate having the plurality of pixel units disposed thereon, and the wires are electrically connected to the chip through the via holes.

15. The display panel of claim 13, wherein the connection wires are located on the side of the base substrate having the plurality of pixel units disposed thereon, the wires are located on a side of the base substrate having the chip disposed thereon, and the connection wires electrically connected to each of the plurality of pixel units are connected to corresponding wires through the via holes.

16. The display panel of claim 13, wherein the first wires extend along a direction of rows of pixel units and the second wires extend along a direction of columns of pixel units.

17. The display panel of claim 16, wherein the wires are located on the side of the base substrate having the plurality of pixel units disposed thereon, and the via holes for accommodating the first wires are located in the regions where the first wires pass by and adjacent to the ending pixel units located at an end of rows of pixel units.

18. The display panel of claim 17, wherein the via holes for accommodating the second wires are located in the regions where the second wires pass by and adjacent to the ending pixel units located at an end of columns of pixel units.

19. The array substrate of claim 1, wherein the gate driving chip connected to the gate lines is located in a region which is close to an ending pixel unit of one of rows of pixel units, and the source driving chip connected to the data lines is located in a region which is close to an ending pixel unit of one of columns of pixel units.

* * * * *